United States Patent
Lee et al.

(10) Patent No.: US 10,553,401 B2
(45) Date of Patent: Feb. 4, 2020

(54) ANTENNA, MICROWAVE PLASMA SOURCE INCLUDING THE SAME, PLASMA PROCESSING APPARATUS, AND METHOD OF MANUFACTURING SEMICONDUCTOR DEVICE

(71) Applicant: Samsung Electronics Co., Ltd., Suwon-si (KR)

(72) Inventors: Yeongkwang Lee, Suwon-si (KR); Yongkyun Park, Suwon-si (KR); Dongsoo Lee, Hwaseong-si (KR); Sangheon Lee, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 322 days.

(21) Appl. No.: 15/453,595

(22) Filed: Mar. 8, 2017

(65) Prior Publication Data
US 2017/0330727 A1    Nov. 16, 2017

(30) Foreign Application Priority Data
May 16, 2016    (KR) ........................ 10-2016-0059703

(51) Int. Cl.
*H01J 37/32*    (2006.01)
(52) U.S. Cl.
CPC ...... *H01J 37/3222* (2013.01); *H01J 37/3244* (2013.01); *H01J 37/32238* (2013.01); *H01J 2237/002* (2013.01)

(58) Field of Classification Search
CPC ............... H01J 37/3222; H01J 37/3244; H01J 37/32238; H01J 2237/002; H01J 2237/334; H01J 2237/3321; H01L 21/67069
See application file for complete search history.

(56) References Cited

U.S. PATENT DOCUMENTS

| | | |
|---|---|---|
| 6,290,807 B1 | 9/2001 | Matsumoto et al. |
| 6,358,361 B1 | 3/2002 | Matsumoto |
| 6,620,290 B2 | 9/2003 | Yamamoto et al. |
| 7,097,782 B2 | 8/2006 | Blalock et al. |
| 8,163,128 B2 | 4/2012 | Kasai et al. |
| 8,647,933 B2 | 2/2014 | Yamazaki |
| 9,305,751 B2 | 4/2016 | Kaneko et al. |
| 2005/0173069 A1 | 8/2005 | Tolmachev et al. |
| 2014/0102367 A1 | 4/2014 | Ishibashi |

(Continued)

FOREIGN PATENT DOCUMENTS

| | | | | |
|---|---|---|---|---|
| JP | 05343334 A | * | 12/1993 | |
| JP | 2697464 B2 | | 9/1997 | |
| JP | 2000012292 A | * | 1/2000 | ........... C23C 16/511 |

(Continued)

*Primary Examiner* — Yuechuan Yu
(74) *Attorney, Agent, or Firm* — Muir Patent Law, PLLC

(57) ABSTRACT

Embodiments of the inventive concepts provide an antenna, a microwave plasma source including the antenna, a plasma processing apparatus including the antenna, and a method of manufacturing method of a semiconductor device. The antenna includes a lower ring having a plurality of output slits, and an upper ring disposed on the lower ring. The upper ring has an input slit transmitting microwave power from an outside of the upper ring onto the lower ring. The upper ring is configured to rotate with respect to the lower ring.

16 Claims, 13 Drawing Sheets

(56) References Cited

U.S. PATENT DOCUMENTS

2015/0170881 A1 6/2015 Komatsu et al.
2015/0371828 A1 12/2015 Stowell

FOREIGN PATENT DOCUMENTS

| | | | |
|---|---|---|---|
| JP | 2000-173989 | A | 6/2000 |
| JP | 2003-142460 | A | 5/2003 |
| JP | 2003332241 | A * | 11/2003 |
| JP | 2005-072371 | A | 3/2005 |
| JP | 4910396 | B2 | 1/2012 |
| JP | 2013-045551 | A | 3/2013 |
| JP | 5242520 | B2 | 4/2013 |
| JP | 2015-115576 | A | 6/2015 |
| JP | 5916534 | B2 | 4/2016 |
| KR | 10-0311104 | B1 | 11/2001 |
| KR | 10-1008746 | B1 | 1/2011 |

* cited by examiner

ANTENNA, MICROWAVE PLASMA SOURCE INCLUDING THE SAME, PLASMA PROCESSING APPARATUS, AND METHOD OF MANUFACTURING SEMICONDUCTOR DEVICE

CROSS-REFERENCE TO RELATED APPLICATIONS

This U.S. non-provisional patent application claims priority under 35 U.S.C. § 119 to Korean Patent Application No. 10-2016-0059703, filed on May 16, 2016, in the Korean Intellectual Property Office, the disclosure of which is hereby incorporated by reference in its entirety.

BACKGROUND

This disclosure relates to an apparatus for fabricating a semiconductor device, for example, to an antenna transmitting microwave power, a microwave plasma source including the same, a plasma processing apparatus, a method of processing a substrate, and a method of manufacturing a semiconductor device.

In general, a semiconductor device may be fabricated by a plurality of unit processes. The unit processes may include a deposition process, a diffusion process, a thermal process, a photolithography process, a polishing process, an etching process, an ion implantation process, and a cleaning process. The etching process among these unit processes may include a dry etching process and a wet etching process. The deposition process and the dry etching process may be performed using a plasma reaction.

SUMMARY

Embodiments of the inventive concepts may provide a microwave plasma source capable of tuning a resonance frequency of microwave power in an antenna.

Embodiments of the inventive concepts may provide a microwave plasma source capable of increasing or maximizing the energy transfer efficiency of microwave power.

According to an embodiment, an antenna includes a lower ring having a plurality of output slits, and an upper ring disposed on the lower ring. The upper ring has an input slit and a cavity formed between the lower ring and the upper ring, wherein the input slit is configured to transmit microwave power from an outside of the upper ring onto the lower ring. The plurality of output slits is configured to transmit microwave power from the cavity to an outside of the lower ring.

According to an embodiment, a microwave plasma source includes an antenna, a microwave generator configured to provide microwave power to the antenna, and a waveguide connecting the microwave generator to the antenna. The antenna includes a lower ring having a plurality of first slits, and an upper ring disposed on the lower ring. The upper ring may have a second slit configured to transmit the microwave power from the waveguide onto the lower ring.

According to an embodiment, a plasma processing apparatus includes a chamber, and a microwave plasma source configured to provide microwave power into the chamber to generate plasma. The microwave plasma source includes an antenna disposed on the chamber, a microwave generator configured to provide the microwave power to the antenna, and a waveguide connecting the microwave generator to the antenna. The antenna includes a lower ring having a plurality of first slits, and an upper ring disposed on the lower ring, the upper ring having a second slit configured to transmit the microwave power from the waveguide onto the lower ring.

According to an embodiment, a microwave plasma source includes an antenna, a microwave generator configured to provide microwave power to the antenna, and a waveguide connecting the microwave generator to the antenna. The antenna includes a first slit connected to the waveguide, a plurality of second slits, and a cavity formed between the first slit and the plurality of second slits, wherein a first boundary surface between the first slit and the cavity extends in a different direction that a second boundary surface between the cavity and the second slits extends.

According to an embodiment, a plasma processing apparatus includes a chamber having an upper housing and a lower housing, and a first microwave plasma source configured to provide first microwave power into the chamber. The first microwave plasma source includes a first antenna disposed on an edge region of the upper housing, a first microwave generator configured to provide the first microwave power to the first antenna, and a first waveguide connecting the first microwave generator to the first antenna. The first antenna includes a first input slit connected to the first waveguide, first output slits, and a cavity formed between the first input slit and the first output slits, wherein a first boundary surface between the first input slit and the cavity extends in a different direction from a direction that a second boundary surface between the cavity and the first output slits extends.

According to an embodiment, a method of manufacturing a semiconductor device includes steps of providing a substrate into a chamber of a plasma processing apparatus, providing microwave power into the chamber to generate plasma in the chamber, processing the substrate by the plasma, and unloading the substrate from the chamber. The providing of the microwave power into the chamber includes tuning a resonance frequency of the microwave power in an antenna of the plasma processing apparatus on the basis of a frequency of the microwave power coming into the antenna of the plasma processing apparatus.

According to some embodiments, a method of manufacturing a semiconductor device comprises providing a substrate into a chamber of a plasma processing apparatus, providing first microwave power into the chamber to generate plasma in the chamber, processing the substrate by the plasma, and unloading the substrate from the chamber, wherein the plasma processing apparatus comprises a first antenna transmitting the first microwave power into the chamber, wherein the first antenna comprises a first slit transmitting microwave into the first antenna, a plurality of second slits transmitting microwave from the first antenna to the chamber, and a first cavity disposed between the first slit and the second slits, wherein a first boundary surface between the first slit and the first cavity extends in a different direction from a direction that a second boundary surface between the first cavity and the second slits.

BRIEF DESCRIPTION OF THE DRAWINGS

The inventive concepts will become more apparent in view of the attached drawings and accompanying detailed description.

DETAILED DESCRIPTION

Figure 1:
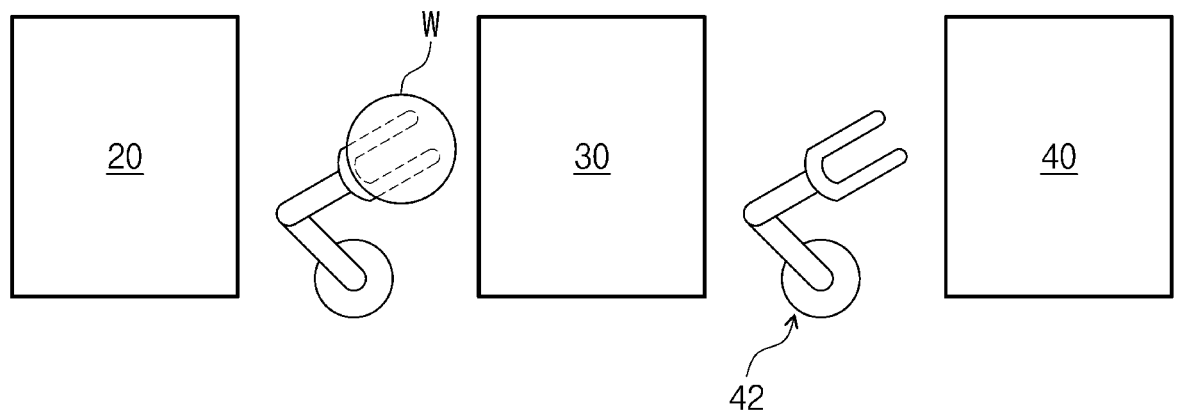
FIG. 1 is a schematic view illustrating a system of fabricating a semiconductor device, according to exemplary embodiments of the inventive concepts.

Hereinafter, example embodiments will be explained in detail with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/". With the exception of "consisting of" and "essentially consisting of," it will be further understood that all transition terms describing elements of a step, component, device, etc., are open ended. Thus, unless otherwise specified (e.g., with language such as "only," "without," etc.), the terms "comprising," "including," "having," etc., may specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present. Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

FIG. 1 is a schematic view illustrating a system 10 of fabricating a semiconductor device, according to exemplary embodiments of the inventive concepts.

Referring to FIG. 1, a system 10 of fabricating a semiconductor device may perform unit processes of a substrate W. For example, the unit processes may include a deposition process, a photolithography process, and/or an etching process. Alternatively, the unit processes may include a diffusion process, a thermal treatment process, a polishing process, an ion implantation process, a cleaning process, and/or an ashing process. In exemplary embodiments, the fabricating system 10 may include a deposition apparatus 20, a photolithography apparatus 30, an etching apparatus 40, and transfer apparatuses 42. The deposition apparatus 20 may perform a deposition process. The deposition apparatus 20 may deposit a thin layer on the substrate W. The substrate W may include a semiconductor wafer. Alternatively, the substrate W may include a transparent substrate formed of glass or plastic. The photolithography apparatus 30 may perform a photolithography process using a photoresist. The photolithography apparatus 30 may form a mask pattern on the substrate W. The etching apparatus 40 may perform an etching process. The etching apparatus 40 may etch the substrate W and/or the thin layer, exposed by the mask pattern. The transfer apparatuses 42 may transfer the substrate W. First and second transfer apparatuses 42 may be disposed between the deposition apparatus 20 and the photolithography apparatus 30 and between the photolithography apparatus 30 and the etching apparatus 40, respectively. As shown in FIG. 1, the deposition apparatus 20, the first transfer apparatus 42, the photolithography apparatus 30, the second transfer apparatus 42, and the etching apparatus 40 may be arranged in series. The system 10 of fabricating a semiconductor device may sequentially perform the unit processes with the substrate W. Alternatively, the apparatuses of the fabricating system 10 may be connected to each other in a cluster type.

In exemplary embodiments, the deposition apparatus 20 and the etching apparatus 40 may process the substrate W by using a plasma reaction. For example, the deposition apparatus 20 may include a sputtering apparatus or a CVD apparatus. For example, the etching apparatus 40 may include a plasma etching apparatus.

Hereinafter, the etching apparatus 40 will be described in detail.

Figure 2:
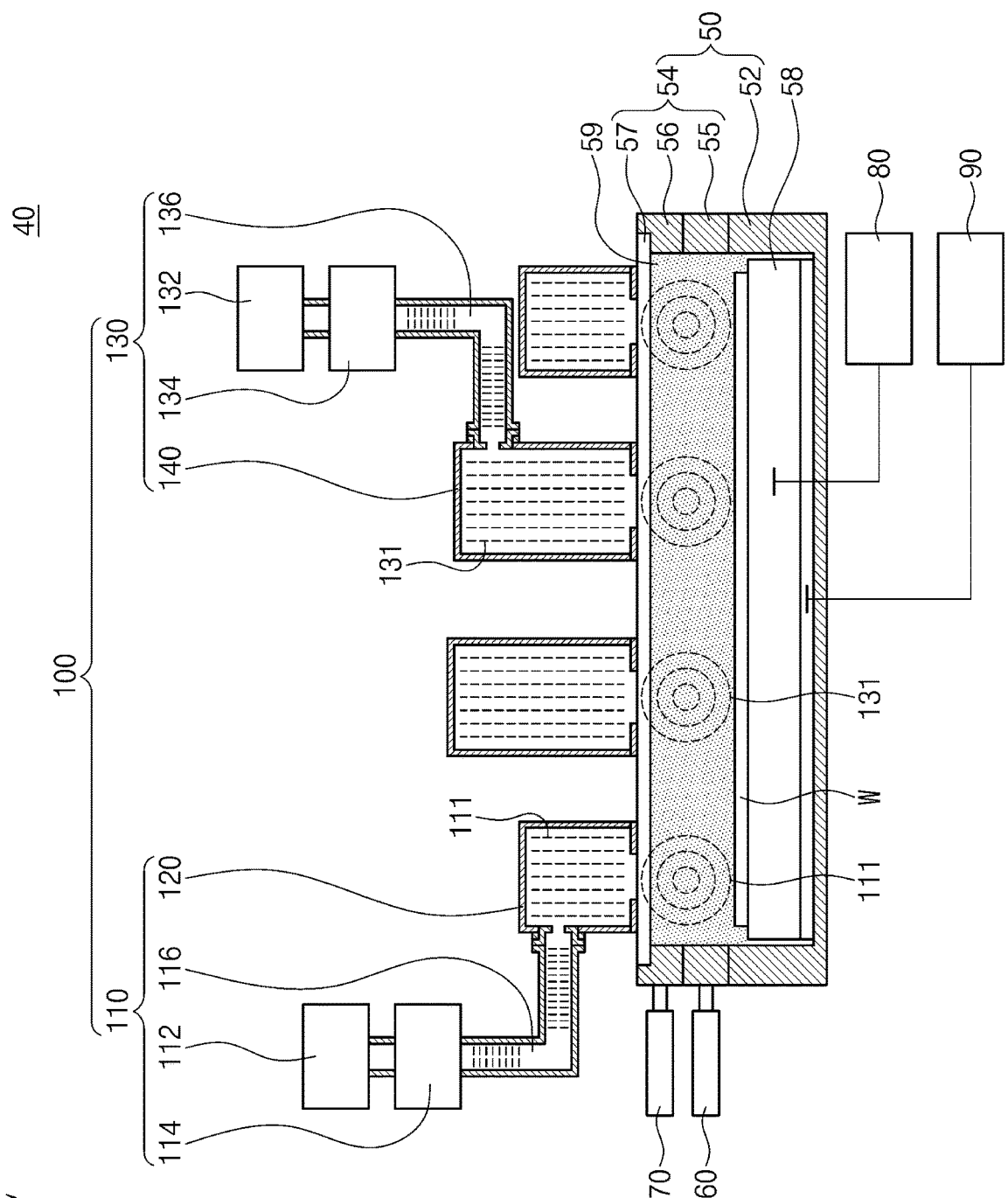
FIG. 2 is a cross-sectional view illustrating an embodiment of an etching apparatus of FIG. 1.

FIG. 2 illustrates an embodiment of the etching apparatus 40 of FIG. 1.

Referring to FIG. 2, the etching apparatus 40 may be a microwave plasma processing apparatus. Alternatively, the etching apparatus 40 may include an inductively coupled plasma (ICP) apparatus or a capacitively coupled plasma (CCP) apparatus. In exemplary embodiments, the etching apparatus 40 may include a chamber 50, a reaction gas supply part 60, a cooling water supply part 70, a constant voltage supply part 80, a high-frequency power supply part 90, and microwave plasma sources 100. The substrate W may be provided into the chamber 50. The reaction gas supply part 60 may provide a reaction gas into the chamber 50. The cooling water supply part 70 may provide cooling water to reduce a temperature of the chamber 50. The constant voltage supply part 80 may provide a constant voltage and/or an electric field into the chamber 50. The high-frequency power supply part 90 may provide high-frequency power into the chamber 50. The microwave plasma sources 100 may provide first and second microwave powers 111 and 131 into the chamber 50. The microwave power may generate plasma 59 of the reaction gas provided in the chamber 50.

Figure 3:
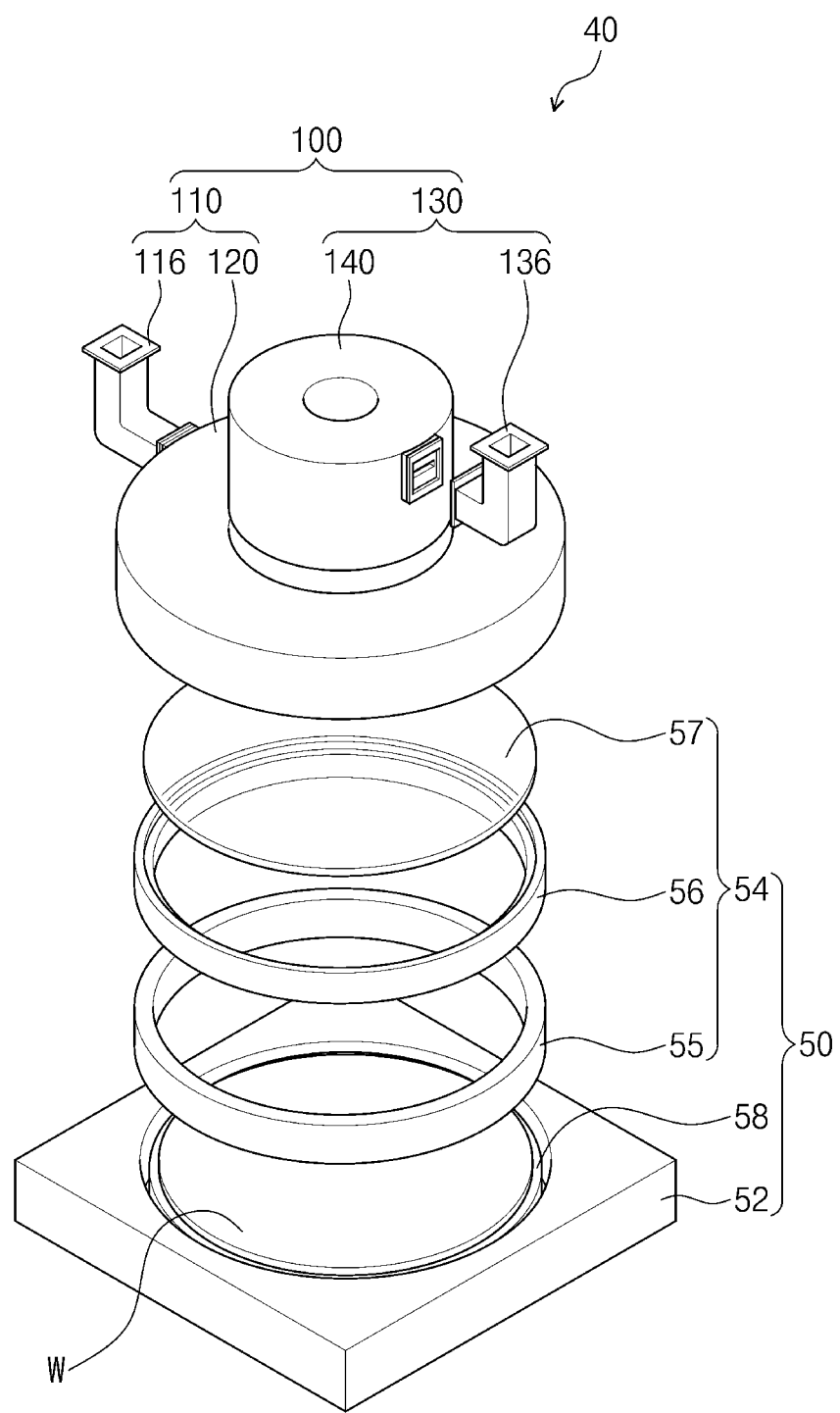
FIG. 3 is an exploded perspective view illustrating the etching apparatus of FIG. 2.

FIG. 3 is an exploded perspective view illustrating the etching apparatus 40 of FIG. 2.

Referring to FIGS. 2 and 3, the chamber 50 may provide a space which is independent of the outside and into which the substrate W is provided. In exemplary embodiments, the chamber 50 may be formed by a lower housing 52, an upper housing 54, and may include the space enclosed by the lower housing 52 and upper housing 54. For example, the inside space of the chamber 50 may be isolated from outside by the lower housing 52 and the upper housing 54. An electrostatic chuck 58 may be provided in the chamber 50.

The lower housing 52 may be disposed under the upper housing 54. The lower housing 52 may be coupled to the upper housing 54 to perform a plasma process with the substrate W. The lower housing 52 and the upper housing 54 may be separated from each other when the substrate W is loaded and/or unloaded.

The electrostatic chuck 58 may be disposed in the lower housing 52. The electrostatic chuck 58 may receive the substrate W. The electrostatic chuck 58 may be connected to the constant voltage supply part 80 and the high-frequency power supply part 90. The substrate W may be fixed on the electrostatic chuck 58 by the constant voltage of the constant voltage supply part 80. The plasma 59 may be concentrated to the substrate W disposed on the electrostatic chuck 58 by the high-frequency power of the high-frequency power supply part 90.

The upper housing 54 may be disposed on the lower housing 52 and the electrostatic chuck 58. In exemplary embodiments, the upper housing 54 may include a gas injection ring 55, a cooling water circulation ring 56, and a window 57.

The gas injection ring 55 may be disposed on the lower housing 52. The gas injection ring 55 may be connected to the reaction gas supply part 60. The reaction gas supply part 60 may provide the reaction gas into the chamber 50 through the gas injection ring 55. For example, the reaction gas may include a strongly acidic gas such as $SF_6$, HF, CF, or $CH_3$.

The cooling water circulation ring 56 may be disposed on the gas injection ring 55. The cooling water circulation ring 56 may be connected to the cooling water supply part 70. The cooling water supply part 70 may provide the cooling water into the cooling water circulation ring 56. The cooling water provided in the cooling water circulation ring 56 may cool the chamber 50.

The window 57 may be disposed on the cooling water circulation ring 56 and over the electrostatic chuck 58. The window 57 may include a dielectric. For example, the window 57 may include aluminum oxide ($Al_2O_3$) and/or quartz. The window 57 may have a disc shape of which an external diameter ranges, for example, from about 20 cm to about 30 cm.

The microwave plasma sources 100 may be disposed on the window 57. In exemplary embodiments, the microwave plasma sources 100 may include a first microwave plasma source 110 and a second microwave plasma source 130. The first and second microwave plasma sources 110 and 130 may provide the first and second microwave powers 111 and 131 into the chamber 50, respectively.

The first microwave plasma source 110 may provide the first microwave power 111 into an edge region of the space of the chamber 50. In exemplary embodiments, the first microwave plasma source 110 may include a first microwave generator 112, a first impedance matching part 114, a first waveguide 116, and a first antenna 120.

The first microwave generator 112 may generate the first microwave power 111. For example, the first microwave generator 112 may include a magnetron. The first microwave generator 112 may generate the first microwave power 111, for example, of several tens KW to thousands KW.

The first impedance matching part 114 may be disposed between the first microwave generator 112 and the first antenna 120. The first impedance matching part 114 may match input and output impedances of the first microwave power 111.

The first waveguide 116 may be connected between the first microwave generator 112 and the first impedance matching part 114 and between the first impedance matching part 114 and the first antenna 120. The first waveguide 116 may transmit the first microwave power 111 from the first microwave generator 112 to the first antenna 120. For example, the first waveguide 116 may include a ceramic tube or a metal tube.

The first antenna 120 may be disposed on an edge of the window 57. In exemplary embodiments, the first antenna 120 may include a toroidal antenna. The first antenna 120 may provide the first microwave power 111 into the edge region of the space of the chamber 50. The first microwave power 111 may induce the plasma 59 on an edge region of the substrate W.

The second microwave plasma source 130 may provide the second microwave power 131 onto central regions of the substrate W, electrostatic chuck 58, and/or window 57. In exemplary embodiments, the second microwave plasma source 130 may include a second microwave generator 132, a second impedance matching part 134, a second waveguide 136, and a second antenna 140.

The second microwave generator 132 may generate the second microwave power 131. In exemplary embodiments, an output power of the first microwave generator 112 may be higher than an output power of the second microwave generator 132. The second microwave generator 132 may generate the second microwave power 131 of several KW to hundreds KW. For example, the second microwave generator 132 may include a solid state generator.

The second impedance matching part 134 may be disposed between the second microwave generator 132 and the second antenna 140. The second impedance matching part 134 may match impedance of the second microwave power 131.

The second waveguide 136 may be connected between the second microwave generator 132 and the second impedance matching part 134 and between the second impedance matching part 134 and the second antenna 140. The second waveguide 136 may transmit the second microwave power 131 from the second microwave generator 132 to the second antenna 140. For example, the second waveguide 136 may include a ceramic tube or a metal tube.

The second antenna 140 may be surrounded by the first antenna 120 in a plan view and may be disposed on the central region of the window 57. For example, the first antenna 120 may be formed in a region outside of the outer boundary of the second antenna 140 when viewed in a plan view. The second antenna 140 may have the substantially same shape as the first antenna 120. However, a size of the second antenna 140 may be different from a size of the first antenna 120. For example, the second antenna 140 may be smaller than the first antenna 120 when viewed from a plan view. In exemplary embodiments, the second antenna 140 may include a toroidal antenna. The second antenna 140 may provide the second microwave power 131 into a central region of the space of the chamber 50. The second microwave power 131 may induce the plasma 59 on a central region of the substrate W. As described herein, the central region and edge region of the substrate W or chamber 50 may be described in relation to each other, wherein the central region is surrounded by the edge region. For example, the central region may cover a certain percentage of the substrate W or chamber 40 around a center of the substrate W or chamber 40 (e.g., 50 percent along the diameter), and the edge region may cover a percentage outside of the central region (e.g., 25 percent on either side of the central region along the diameter).

When the first microwave power 111 does not interfere with the second microwave power 131, the plasma 59 may be induced with a maximum energy.

Figure 4:
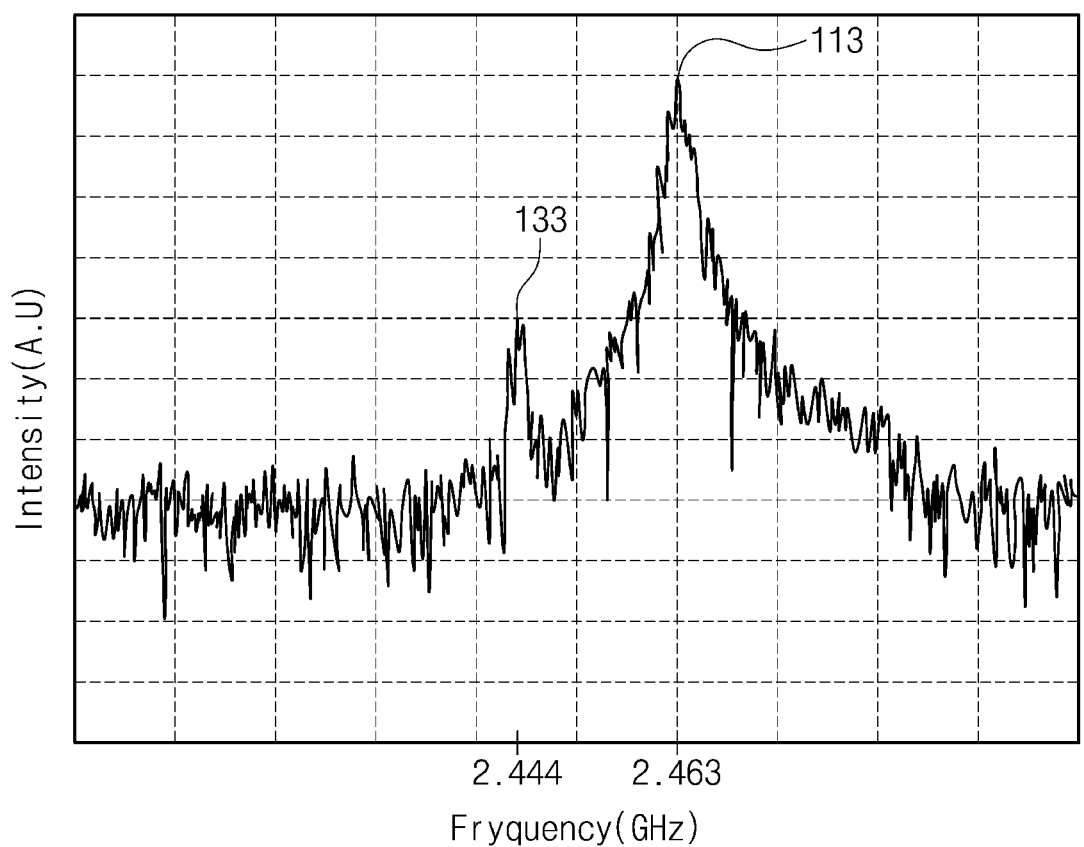
FIG. 4 is a graph illustrating first and second input frequencies of first and second microwave powers of FIG. 2.

FIG. 4 is a graph illustrating first and second input frequencies 113 and 133 of the first and second microwave powers 111 and 131 of FIG. 2. The first and second input frequencies 113 and 133 may be frequencies of microwaves coming into the first and second antennas 120 and 140, respectively.

Referring to FIG. 4, the first microwave power 111 and the second microwave power 131 may have a first input frequency 113 and a second input frequency 133, respectively. The first and second input frequencies 113 and 133 may be different from each other. For example, the first input frequency 113 of the first microwave power 111 may be about 2.463 GHz, and the second input frequency 133 of the second microwave power 131 may be about 2.444 GHz. The first input frequency 113 may be constant. For example, the first input frequency 113 may have a predetermined frequency. For example, the first microwave power 111 may have a fixed first input frequency 113. The second input frequency 133 may vary. Examples of the first and second input frequencies 113 and 133 measured at the edge region of the chamber 50 are shown in FIG. 4.

Referring to FIGS. 2 to 4, the first antenna 120 may resonate the first microwave power 111. The first microwave power 111 in the first antenna 120 may have a first resonance frequency. The first resonance frequency may be mainly determined by a geometric structure of the first antenna 120. For example, the first resonance frequency may depend on a shape and/or a position of the first antenna 120. When the first input frequency 113 is equal to the first resonance frequency, the energy transfer efficiency of the first microwave power 111 may have the maximum value. For example, the first resonance frequency may determine the energy transfer efficiency of the first microwave power 111.

Likewise, the second antenna 140 may resonate the second microwave power 131. The second microwave power 131 in the second antenna 140 may have a second resonance frequency. The second resonance frequency may be determined by a geometric structure of the second antenna 140. For example, the second resonance frequency may depend on a shape and/or a position of the second antenna 140. When the second input frequency 133 is equal to the second resonance frequency, the energy transfer efficiency of the second microwave power 131 may have the maximum value. For example, the second resonance frequency may determine the energy transfer efficiency of the second microwave power 131.

The first microwave generator 112 may transmit the first microwave power 111 into the first antenna 120, the first microwave power 111 may have the first input frequency 113 fixed regardless of the first resonance frequency of the first antenna 120. Thus, the energy transfer efficiency of the first microwave power 111 may be mainly determined by the first resonance frequency of the first antenna 120. For example, the first antenna 120 may tune the first resonance frequency of the first microwave power 111 to a value similar to the first input frequency 113.

The second microwave generator 132 may tune the second input frequency 133 to the second resonance frequency of the second antenna 140. The second microwave generator 132 may increase or maximize the energy transfer efficiency of the second microwave power 131, for example, by tuning the second input frequency 133. Alternatively, the second antenna 140 may tune the second resonance frequency of the second microwave power 131 to the second input frequency 133, for example, to increase the energy transfer efficiency.

Figure 5:
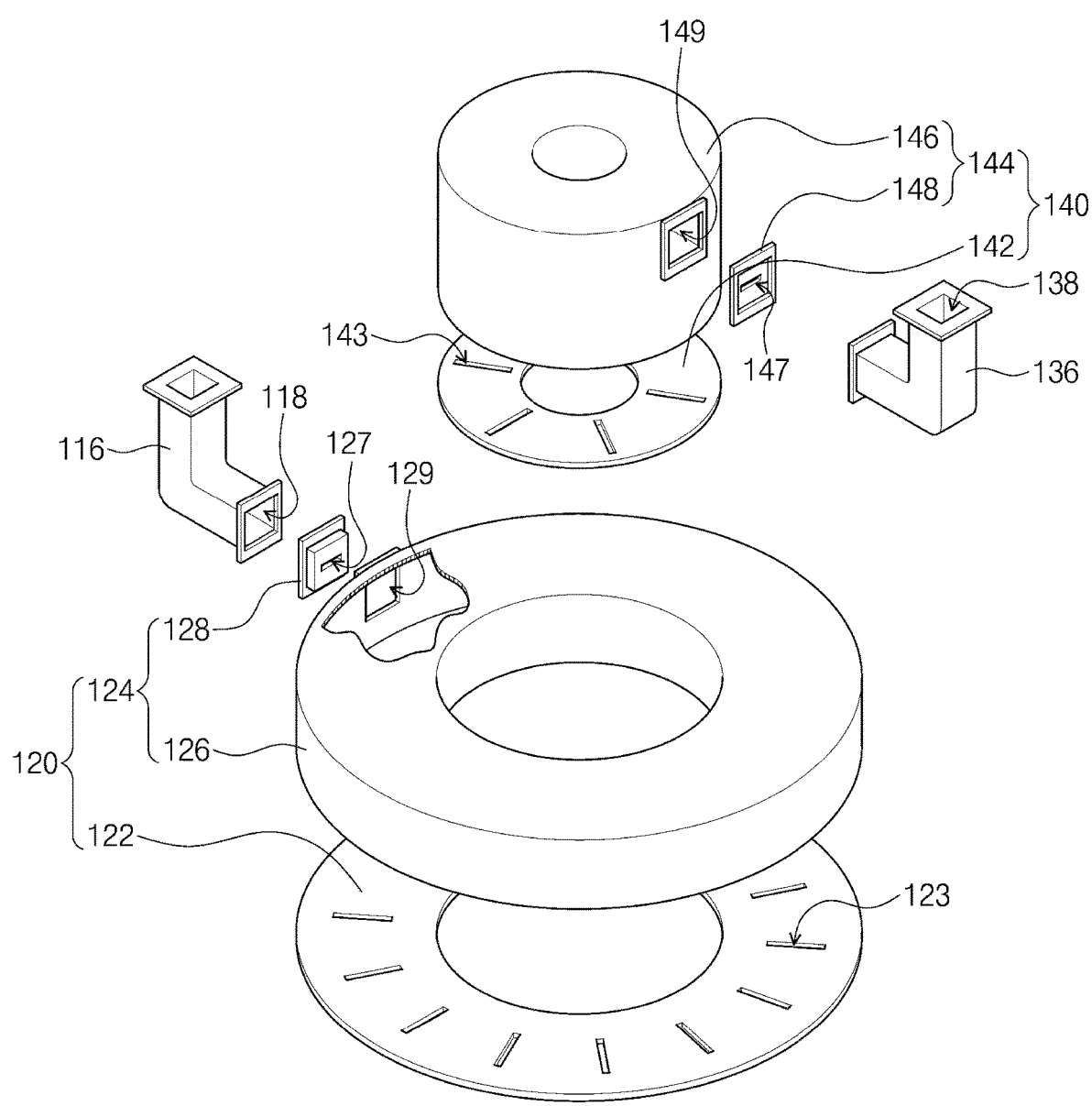
FIG. 5 is an exploded perspective view illustrating an embodiment of first and second antennas of FIGS. 2 and 3.
Figure 6:
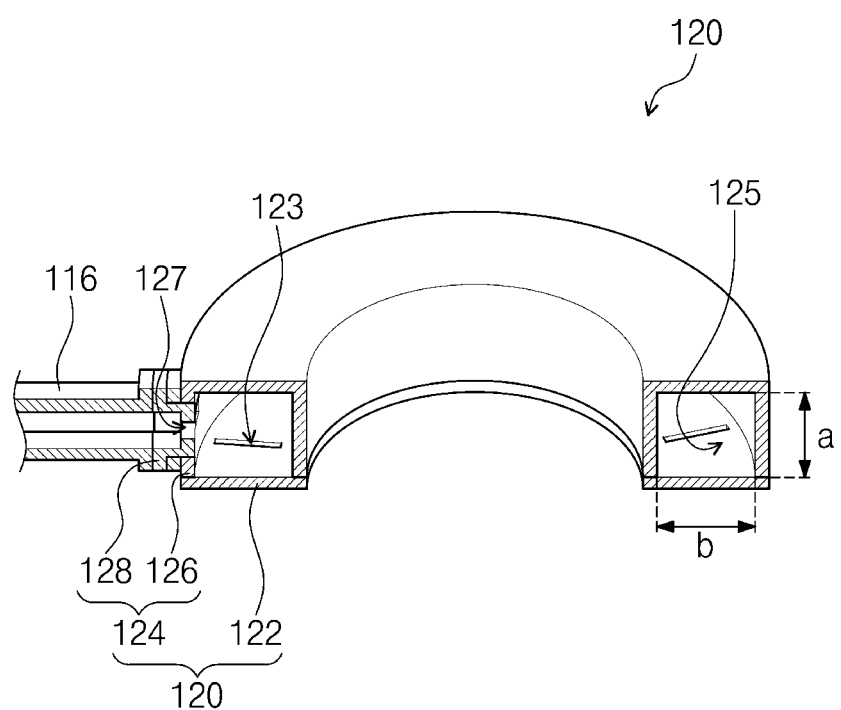
FIG. 6 is a perspective view illustrating a first lower ring and a first upper ring of FIG. 5, which are coupled to each other.

FIG. 5 illustrates an embodiment of the first antenna 120 and the second antenna 140 of FIGS. 2 and 3. FIG. 6 is a perspective view illustrating a first lower ring 122 and a first upper ring 124 of FIG. 5, coupled to each other.

Referring to FIGS. 2, 3, 5, and 6, the first antenna 120 may include a first lower ring 122 and a first upper ring 124.

The first lower ring 122 may include first output slits 123 for the first microwave power 111 to pass through. The first output slits 123 may be paths to provide the first microwave power 111 to the outside of a first cavity 125, e.g., the window 57 of the chamber 50. The first microwave power 111 may be provided to the chamber 50 through the window 57. The first output slits 123 may respectively extend in radial directions in the first lower ring 122 and may be arranged along an azimuthal direction (e.g., a circumferential direction) of the first lower ring 122. In exemplary embodiments, an external diameter of the first lower ring 122 may be smaller than an external diameter of the window 57. The first lower ring 122 may be smaller than the gas injection ring 55 and the cooling water circulation ring 56. For example, the first lower ring 122 may have an internal diameter of about 5 cm to about 10 cm and the external diameter of about 10 cm to about 20 cm. The number of the first output slits 123 may be about 14, for example, between 11 and 17. The first output slits 123 may be spaced apart from each other and may be arranged at intervals of first azimuths $\theta_1$ of about 25.7 degrees (see FIG. 7A), e.g., between 20 degrees and 35 degrees. For example, the first azimuths $\theta_1$ may be azimuth angles having an origin positioned at a center of the first lower ring 122 on a reference plane parallel to a surface of the first lower ring 122. Each of the first output slits 123 may have a width of about 1 mm to about 3 mm and a length of about 4 cm to about 9 cm.

The first upper ring 124 may be disposed on the first lower ring 122. The first lower ring 122 may support the first upper ring 124. In exemplary embodiments, the first cavity 125 may be defined by the first lower ring 122 and the first upper ring 124. The first microwave power 111 may propagate along the first cavity 125. In exemplary embodiments, the first upper ring 124 may include a first cover ring 126 and a first slit plate 128.

The first cover ring 126 may cover the first lower ring 122. In exemplary embodiments, a width (or an external diameter) of the first cover ring 126 may be equal to a width (or the external diameter) of the first lower ring 122. The first cover ring 126 may have a first hole 129. The first hole 129 may be disposed adjacent to the first waveguide 116. The first hole 129 may be greater than a first pipe hole 118 of the first waveguide 116. In exemplary embodiments, a width of the first hole 129 may be equal to an external diameter (or width) of the first waveguide 116. In exemplary embodiments, the first hole 129 may have a quadrilateral shape.

The first slit plate 128 may be inserted in the first hole 129. The first hole 129 may receive a portion of the first slit plate 128. The received portion of the first slit plate 128 may have a radius of curvature which is equal to a radius of curvature of an inner sidewall of the first cover ring 126. For example, a surface of the received portion of first slit plate 128 may have a radius of curvature equal to a radius of curvature of an inner side of the outer wall of the first cover ring 126. In exemplary embodiments, the first slit plate 128 may have a first input slit 127. The first input slit 127 may face in a direction different from longitudinal directions of the first output slits 123. For example, a boundary surface between the first input slit 127 and the first cavity 125 may not be parallel to a boundary surface between the first cavity 125 and the first output slits 123. For example, the first input slit 127 may be elongated in a direction crossing the nearest first output slit. For example, the first input slit 127 may be elongated substantially perpendicularly to a direction that one of the nearest first output slit is elongated. The first input slit 127 may be disposed at an outer sidewall of the first cover ring 126. The first input slit 127 may have a width smaller than an internal diameter (or width) of the first waveguide 116. The first slit 127 may have a length substantially the same as or smaller than an internal width of the first waveguide 116. The first input slit 127 may have the same size as the first output slits 123. For example, the first input slit 127 may have the width of about 1 mm to about 3 mm and a length of about 4 cm to about 9 cm. The first input slit 127 may transmit the first microwave power 111 into the first cavity 125. For example, the first microwave power 111 may be provided from the first waveguide 116 into the first cavity 125 through the first input slit 127.

The first microwave power 111 may resonate in the first cavity 125. The first resonance frequency of the first microwave power 111 may be determined according to a geometric structure (e.g., a dimension) of the first cavity 125. For example, the first resonance frequency may be determined by a width b of the first cavity 125, the widths and lengths of the first output slits 123, and the width and length of the first input slit 127. A height of the first cavity 125 may be irrelevant to the first resonance frequency. For example, the first resonance frequency may decrease as the width b of the first cavity 125 increases. The width b of the first cavity 125 may be inversely proportional to the square of the first resonance frequency. In certain embodiments, the first slit plate 128 may be integrated in the first cover ring 126 and/or the first wave guide 116. For example, the first wave guide 116, the first slit plate 128, and the first cover ring 126 may be integrated in one body.

Even though not shown in the drawings, the first cover ring 126 may be connected directly to the first waveguide 116 without the first slit plate 128, and the first cavity 125 may be expanded to the first pipe hole 118 of the first waveguide 116. In this case, the first pipe hole 118 may vary a shape of the first cavity 125, and the first pipe hole 118 and the first cavity 125 may constitute an asymmetric ring shape. In this case, the first microwave power 111 may not resonate in the first pipe hole 118 and the first cavity 125, and thus an interrelation between the first cavity 125 and the first resonance frequency may not be valid. In this case, the first antenna 120 may increase a reflectance of the first microwave power 111 but may reduce the energy transfer efficiency of the first microwave power 111.

According to exemplary embodiments of the inventive concepts, the first slit plate 128 may separate the first pipe hole 118 from the first cavity 125. The first input slit 127 may reduce or minimize an opening cross-section area between the first pipe hole 118 and the first cavity 125. The first slit plate 128 may allow the first cavity 125 to have a substantially symmetric ring shape. The first input slit 127 may minimize the reduction of the first resonance frequency.

The first resonance frequency may be tuned according to a spatial structure or spatial distances between the first input slit 127 and the first output slits 123. In exemplary embodiments, the first lower ring 122 may rotate along the first upper ring 124. In certain embodiments, the first lower ring 122 may be configured to rotate along the first upper ring 124 with respect to an axis passing through a center of the first lower ring 122. For example, distances between the first input slit 127 and the first output slits 123 may be adjusted by rotating the first lower ring 122 with respect to an axis passing perpendicularly through a center of the first lower ring 122. Thus, the first output slits 123 may move with respect to the first input slit 127 to form different distances from the first input slit 127. The dimension of the first cavity 125 may vary. Thus, the first resonance frequency may be tuned to become similar to the first input frequency 113. For example, the first resonance frequency may depend on a dimension of the first cavity 125.

FIGS. 7A to 7D are plan views illustrating a change in azimuth between the first input slit 127 and the first output slits 123 according to a position of the first lower ring 122 of FIG. 5.

Referring to FIGS. 7A to 7D, the first lower ring 122 may rotate with respect to the first upper ring 124 by the azimuths of 0 degree, 45 degrees, 90 degrees, and 135 degrees in the azimuthal direction of the first lower ring 122. For example, the azimuthal direction may be an azimuthal direction on a reference plane parallel to a surface of the first lower ring 122, and the azimuthal direction may have an origin positioned at a center of the first lower ring 122. The first output slits 123 of first lower ring 122 may move with respect to the first input slit 127.

Figure 7A:
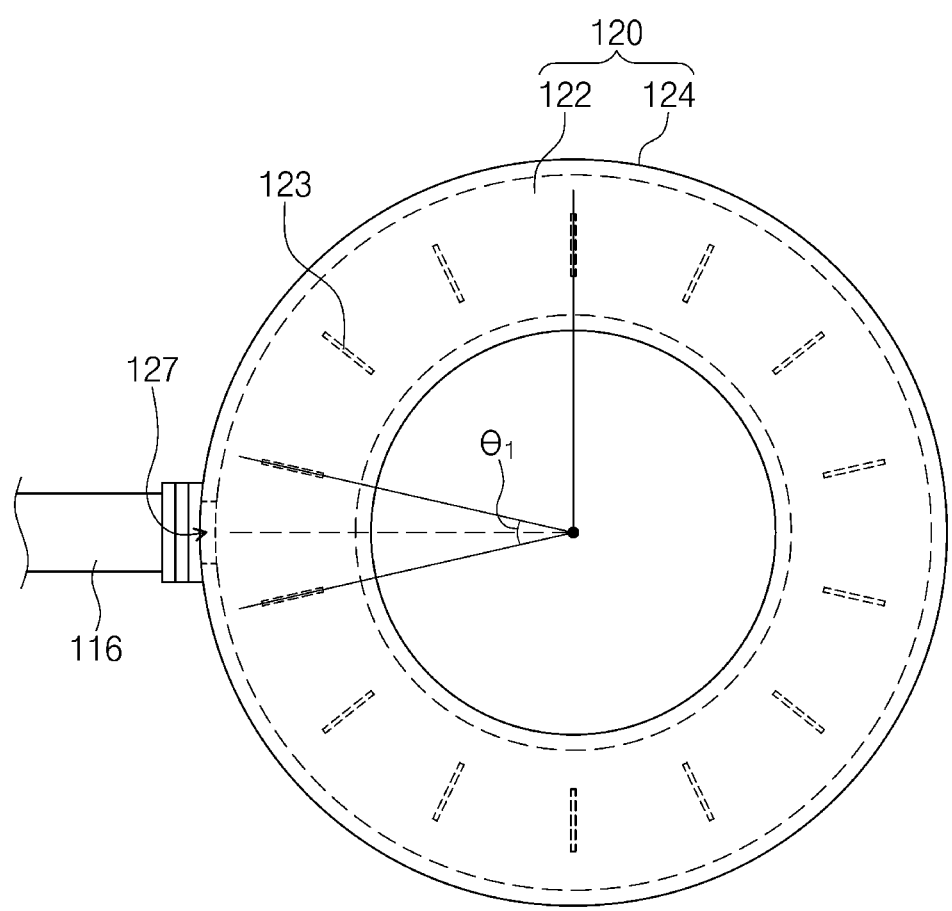
FIGS. 7A to 7D are plan views illustrating a change in azimuth between a first input slit and first output slits according to a position of the first lower ring of FIG. 5.
Figure 7B:
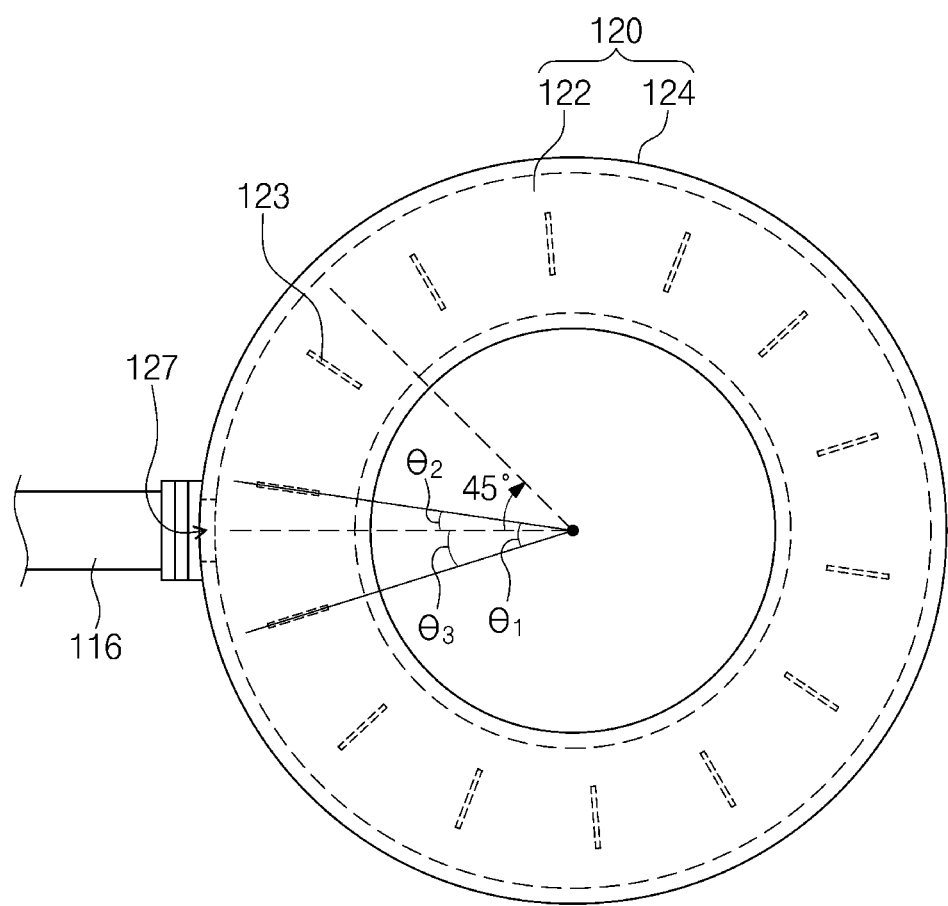
Figure 7C:
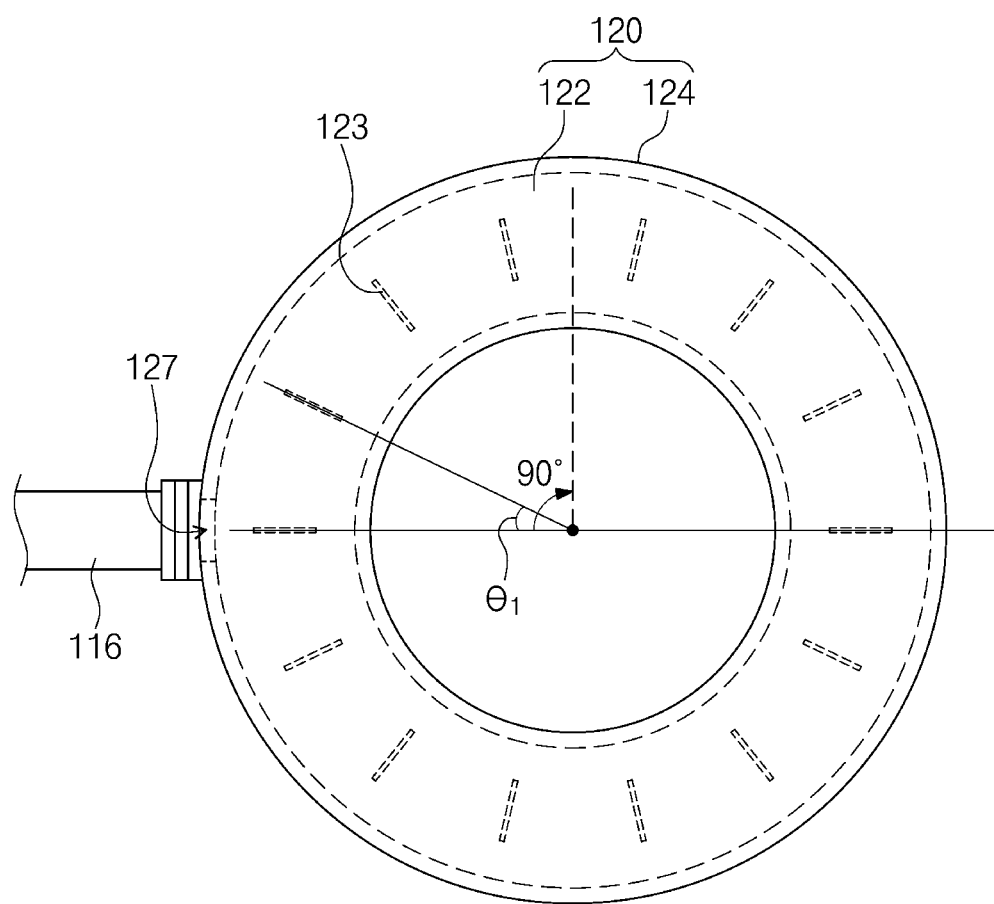
Figure 7D:
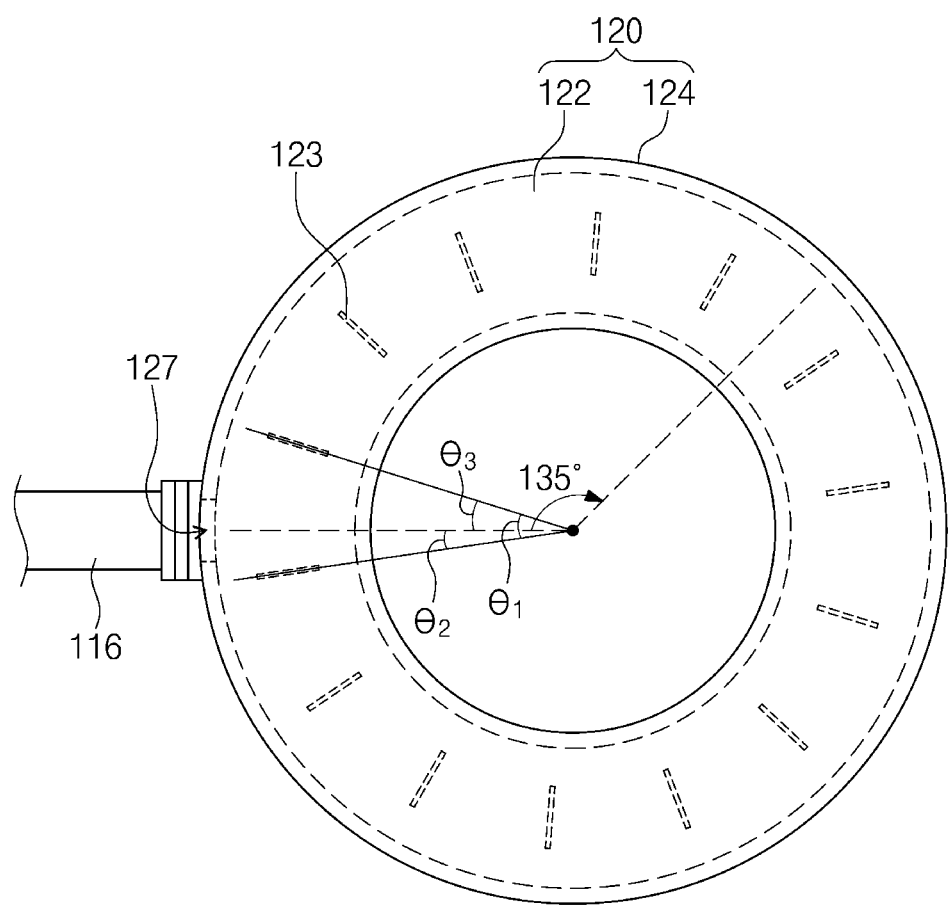
Figure 8:
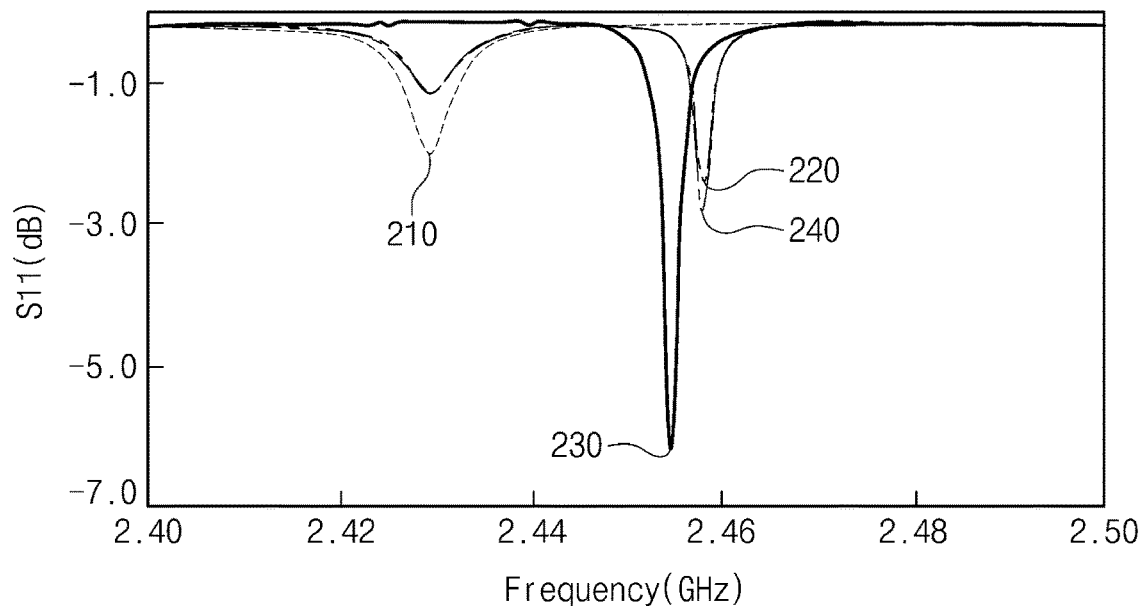
FIG. 8 is a graph illustrating a first resonance frequency and a reflection coefficient of the first microwave power according to rotation of the first lower ring of FIGS. 7A to 7D.

FIG. 8 is a graph illustrating the first resonance frequency and a reflection coefficient S11 of the first microwave power 111 according to the rotation of the first lower ring 122 of FIGS. 7A to 7D.

Referring to FIGS. 7A and 8, the first input slit 127 may initially face in a central direction between the first output slits 123 adjacent to each other. For example, the first input slit 127 may face in a central direction of the first azimuth $\theta_1$. For example, as shown in FIG. 7A, the first input slit 127 may be between two output slits 123 dividing the first azimuth $\theta_1$ into two substantially same azimuthal angles. In one embodiment, in the case in which the first lower ring 122 does not rotate (see 210 of FIG. 8), the first microwave power 111 may have the first resonance frequency of about 2.428 GHz. In this case, a difference between the first resonance frequency and the first input frequency 113 may be 0.035 GHz. In this case, the difference between the first resonance frequency and the first input frequency 113 may have the greatest value. At this time, the energy transfer efficiency of the first microwave power 111 may be minimized.

The first microwave power 111 may have a reflection coefficient S11 of about −2.0 dB. The energy transfer efficiency may increase as the reflection coefficient S11 becomes lower. However, the energy transfer efficiency may be mainly determined by matching of the first resonance frequency and the first input frequency 113. This may be because the energy transfer efficiency according to the reflection coefficient S11 is partially controlled by the impedance matching of the impedance matching part 114.

Referring to FIGS. 7B, 7D, and 8, in the cases in which the first lower ring 122 rotates by 45 degrees and 135 degrees (see 220 and 240 of FIG. 8), the first microwave power 111 may have the first resonance frequency of about 2.459 GHz. In these cases, the first microwave power 111 may have reflection coefficients S11 of about −2.5 dB and about −2.8 dB. In these cases, a difference between the first resonance frequency and the first input frequency 113 may be 0.004 GHz. In these cases, the first resonance frequency may have the most similar value to the first input frequency 113. At this time, the energy transfer efficiency of the first microwave power 111 may have the highest value. For example, the first input slit 127 may face in a direction that makes a second azimuth $\theta_2$ with one of the first output slits 123 adjacent to each other and makes a third azimuth $\theta_3$ with the other of the adjacent first output slits 123. For example, the second azimuth $\theta_2$ may be about 6.45 degrees, e.g., between 5 degrees and 8 degrees, and the third azimuth $\theta_3$ may be about 19.25 degrees, e.g., between 17 degrees and 23 degrees. For example, the second azimuth $\theta_2$ and the third azimuth $\theta_3$ may be azimuthal angles having an origin positioned at a center of the first lower ring 122, and on a reference plane parallel to a surface of the first lower ring 122.

Referring to FIGS. 7C and 8, in the case in which the first lower ring 122 rotates by 90 degrees (see 230 of FIG. 8), the first microwave power 111 may have the first resonance frequency of about 2.455 GHz and the reflection coefficient S11 of about −6.2 dB. In this case, a difference between the first resonance frequency and the first input frequency 113 may be about 0.008 GHz. The energy transfer efficiency in this case of the rotation of 90 degrees may be lower than the energy transfer efficiencies in the cases of the rotation of 45 degrees and 135 degrees. For example, a longitudinal direction of the first input slit 127 may be substantially perpendicular to a longitudinal direction of one of the first output slits 123.

Referring again to FIGS. 2, 3, and 5, the second antenna 140 may include a second lower ring 142 and a second upper ring 144. The second lower ring 142 and the second upper ring 144 may define a second cavity. The second microwave power 131 may propagate along the second cavity.

The second lower ring 142 may include second output slits 143 of the second microwave power 131. The second output slits 143 may provide the second microwave power 131 to the outside of the second cavity, e.g., the window 57 of the chamber 50. The second microwave power 131 may be provided into the chamber 50 through the window 57. The second output slits 143 may respectively extend in radial directions of the second lower ring 142 and may be arranged along an azimuthal direction (i.e., a circumferential direction) of the second lower ring 142. For example, the second lower ring 142 may have an internal diameter of about 3 cm to about 8 cm and an external diameter of about 8 cm to about 12 cm. The number of the second output slits 143 may be about 6, for example, from 4 to 9. The second output slits 143 may be spaced apart from each other and may be arranged at intervals of azimuths of about 60 degrees, e.g., between about 40 degrees and about 90 degrees. For example, the azimuths may be azimuthal angles having an origin positioned at a center of the second lower ring 142, and on a reference plane parallel to a surface of the second lower ring 142. Each of the second output slits 143 may have a width of about 1 mm to about 3 mm and a length of about 3 cm to about 5 cm.

The second upper ring 144 may be disposed on the second lower ring 142. The second lower ring 142 may support the second upper ring 144. In exemplary embodiments, the second upper ring 144 may include a second cover ring 146 and a second slit plate 148.

The second cover ring 146 may cover the second lower ring 142. The second cover ring 146 may have a second hole 149. The second hole 149 may be disposed adjacent to the second waveguide 136. The second hole 149 may be greater than a second pipe hole 138 of the second waveguide 136. In exemplary embodiments, a width of the second hole 149 may be equal to an external diameter or width of the second waveguide 136. For example, the second hole 149 may have a quadrilateral shape, like the first hole 129.

The second slit plate 148 may be inserted in the second hole 149. The second hole 149 may receive a portion of the second slit plate 148. The received portion of the second slit plate 148 may have a radius of curvature which is equal to a radius of curvature of an inner sidewall of the second cover ring 146. For example, the radius of curvature of the received portion of the second slit plate 148 may be substantially the same as the radius of curvature of an inner side of the outer wall of the second cover ring 146. In exemplary embodiments, the second slit plate 148 may have a second input slit 147. The second input slit 147 may have the same size as the second output slits 143. For example, the second input slit 147 may have a width of about 1 mm to about 3 mm and a length of about 3 cm to about 5 cm. The second input slit 147 may transmit the second microwave power 131 into the second cavity. For example, the second microwave power 131 may be provided from the second waveguide 136 into the second cavity through the second input slit 147. The second microwave power 131 may resonate in the second cavity.

The second lower ring 142 may rotate along the second upper ring 144. For example, the second output slits 143 may move with respect to the second input slit 147. A dimension of the second cavity may vary. The second resonance frequency of the second microwave power 131 in the second cavity may be tuned. For example, the second resonance frequency may be tuned by a relative position between the second input slit 147 and the second output slits 143, and/or by a dimension of the second cavity.

Figure 9:
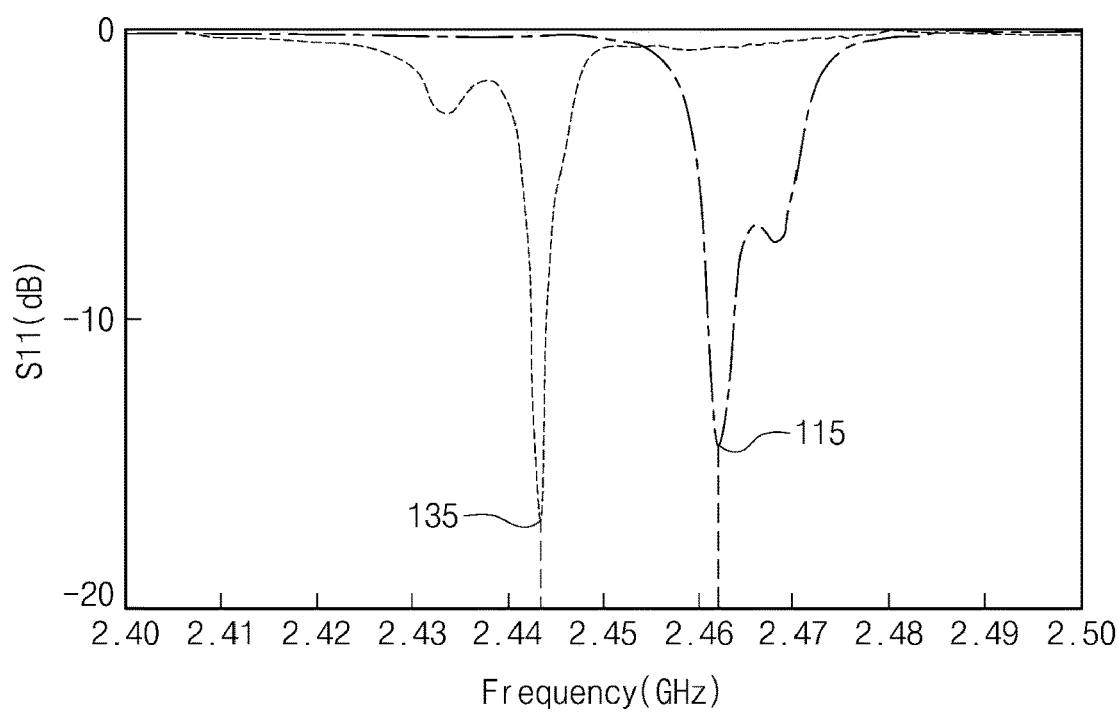
FIG. 9 is a graph illustrating first and second resonance frequencies of the first and second microwave powers of FIG. 2.

FIG. 9 is a graph illustrating the first and second resonance frequencies 115 and 135 of the first and second microwave powers 111 and 131 of FIG. 2.

Referring to FIG. 9, the first resonance frequency 115 of the first microwave power 111 may be equal to the first input frequency 113, and the second resonance frequency 135 of the second microwave power 131 may be equal to the second input frequency 133. For example, the first resonance frequency 115 may be about 2.463 GHz, and the second resonance frequency 135 may be about 2.444 GHz. Thus, the energy transfer efficiencies of the first microwave power 111 and the second microwave power 131 may be maximized.

Normalized ion densities and normalized etch rates of the plasma 59 using the first and second microwave powers 111 and 131 will be described hereinafter.

Figure 10:
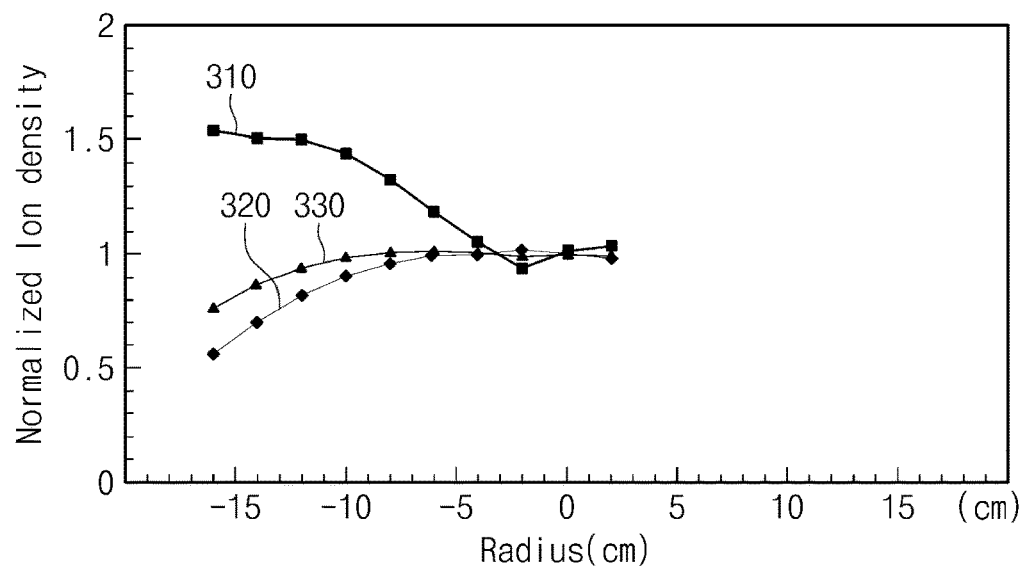
FIG. 10 is a graph illustrating normalized ion densities of plasma of the first and second microwave powers on a central region and an edge region of a substrate of FIG. 2.

FIG. 10 is a graph illustrating normalized ion densities of the plasma 59 of the first and second microwave powers 111 and 131 on various regions of the substrate W of FIG. 2. The ion densities of the plasma 59 are normalized with respect to a plasma density 59 on a central region of the substrate W. For example, the normalized ion densities are values obtained by dividing ion densities of the plasma 59 in respective regions of the substrate W by an ion density of the plasma 59 in a center region of the substrate W.

Referring to FIG. 10, normalized ion densities 310 and 320 are examples obtained by respective first and second microwave powers 111 and 131. Normalized ion densities 330 represent ion densities generated by both of the first and second microwave powers 111 and 131. The normalized ion densities 310, 320, and 330 of the plasma 59 may be different from each other on an edge region of the substrate W by methods of using the first and second microwave powers 111 and 131. The horizontal axis of FIG. 10 shows a horizontal distance from a center of the substrate W (e.g., a radius of the substrate W), and the vertical axis of FIG. 10 shows a value of the normalized ion density.

The normalized ion density 310 of the plasma 59 generated by the first microwave power 111 may be higher than 1 on the edge region of the substrate W. This may be because the first microwave power 111 mainly generates the plasma 59 on the edge region of the substrate W. For example, the first microwave power 111 may generate more plasma in an edge area than in a center area of the substrate W.

The normalized ion density 320 of the plasma 59 generated by the second microwave power 131 may be lower than 1 on the edge region of the substrate W. This may be because the second microwave power 131 mainly generates the plasma 59 on the central region of the substrate W. For example, the second microwave power 131 may generate more plasma in a center area than in an edge area of the substrate W.

The normalized ion density 330 of the plasma 59 generated by both the first and second microwave powers 111 and 131 may be between the normalized ion density 310 of the plasma 59 of the first microwave power 111 and the normalized ion density 320 of the plasma 59 of the second microwave power 131 on the edge region of the substrate W. This may be because the combined power of the first and second microwave powers 111 and 131 may substantially uniformly generate plasma ions on the central region and the edge region of the substrate W. In FIG. 10, the combined ion densities 330 show that the ion densities in the edge region is lower than the ion density in the center region. This difference of the ion densities may be within an allowance. In certain embodiments, this difference of the ion densities may be adjusted by tuning the first and second microwave powers 111 and 131.

Figure 11:
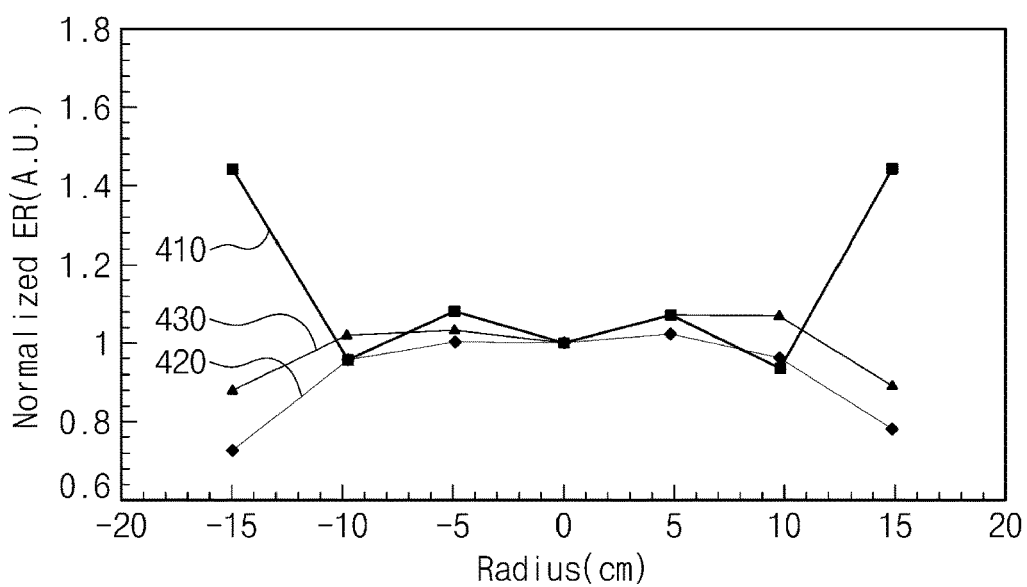
FIG. 11 is a graph illustrating normalized etch rates at the central region and the edge region of the substrate of FIG. 2.

FIG. 11 is a graph illustrating normalized etch rates at the central region and the edge region of the substrate W of FIG. 2. The etch rates are normalized with respect to an etch rate in the central region. For example, the normalized etch rates are values obtained by dividing etch rates of corresponding regions of the substrate W by an etch rate of a center region of the substrate W.

Referring to FIG. 11, the normalized etch rates 410, 420, and 430 may be different from each other on the edge region of the substrate W by methods of using the first and second microwave powers 111 and 131.

The normalized etch rate 410 of the plasma 59 by the first microwave power 111 may be higher than 1 at the edge region of the substrate W. This may be because the ion density of the plasma 59 generated by the first microwave power 111 is higher at the edge region of the substrate W than at the central region of the substrate W.

On the contrary, the normalized etch rate 420 of the plasma 59 by the second microwave power 131 may be lower than 1 at the edge region of the substrate W. This may be because the ion density of the plasma 59 generated by the second microwave power 131 is higher at the central region of the substrate W than at the edge region of the substrate W.

The normalized etch rate 430 of the plasma 59 by both the first and second microwave powers 111 and 131 may be between the normalized etch rate 410 of the plasma 59 of the first microwave power 111 and the normalized etch rate 420 of the plasma 59 of the second microwave power 131 at the edge region of the substrate W. This may be because the ion density of the plasma 59 generated by the first and second microwave powers 111 and 131 may be substantially uniform on the central region and the edge region of the substrate W.

Figure 12:
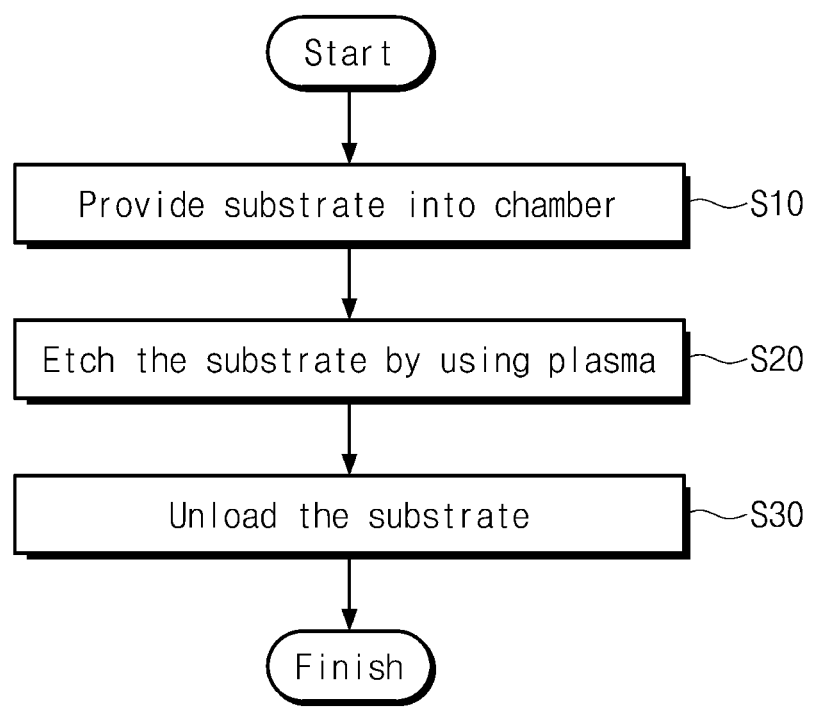
FIG. 12 is a flow chart illustrating a method of processing a substrate by using the etching apparatus of FIG. 2, according to exemplary embodiments of the inventive concepts.

FIG. 12 is a flow chart illustrating a method of processing a substrate by using the etching apparatus 40 of FIG. 2, according to exemplary embodiments of the inventive concepts.

Referring to FIGS. 2 and 12, a substrate W may be provided into the chamber 50 (S10). The substrate W may include a silicon wafer or another wafer, e.g., a compound semiconductor wafer. The substrate W may include a semiconductor layer, a metal layer, an interlayer insulating layer, and/or a photoresist layer, which are disposed on a wafer.

Next, the substrate W may be etched using the plasma 59 (S20). The plasma 59 may be induced on the substrate W by the first microwave power 111 and the second microwave power 131. The first resonance frequency 115 of the first microwave power 111 may be tuned to match with the first input frequency 113. For example, the first resonance frequency 115 may be substantially the same as the first input frequency 113. The second resonance frequency 135 of the second microwave power 131 may be tuned to match with the second input frequency 133. For example the second resonance frequency 135 may be substantially the same as the second input frequency 133.

Next, the substrate W may be unloaded from the chamber 50 (S30). Subsequently, an ashing process or a cleaning process may be performed on the substrate W.

In certain embodiments, a layer of material may be deposited on the substrate W instead of etching the substrate W in step S20 of the above embodiment. The layer of material deposited in step S20 may be, for example, an insulator layer.

As described above, the microwave plasma source according to some embodiments of the inventive concepts may include the antenna having the input slit, the output slits, and the cavity. The cavity may be formed between the input slit and the output slits. The microwave power may resonate in the cavity. The output slits may move relative to the input slit. The resonance frequency of the microwave power in the cavity may be tuned to match with the input frequency. Thus, the energy transfer efficiency of the microwave power may be maximized.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the invention is to be determined by the broadest permissible interpretation of the following claims and their equivalents, and shall not be restricted or limited by the foregoing description.

What is claimed is:

1. An antenna comprising:
a lower ring having a plurality of output slits;
an upper ring disposed on the lower ring, the upper ring having an input slit; and
a cavity formed between the lower ring and the upper ring,
wherein the input slit is configured to transmit microwave power from an outside of the upper ring onto the lower ring,
wherein the plurality of output slits is configured to transmit microwave power from the cavity to an outside of the lower ring,
wherein the input slit is disposed within an azimuthal angle formed by a vertex and the closest two of the plurality of output slits to the input slit, the vertex positioned at a center of the lower ring in a plan view, and
wherein the input slit is asymmetrically closer to one than the other of the closest two of the plurality of output slits.

2. The antenna of claim 1, wherein the output slits are spaced apart from each other and are arranged in an azimuthal direction in the lower ring,
wherein the lower ring is configured to rotate along the upper ring, and
wherein the output slits are configured to move in the azimuthal direction with respect to the upper ring while each of the output slits maintains an opening through the lower ring and through which the microwave power passes,
wherein the opening is configured to maintains its size when the output slits move in the azimuthal direction,
wherein the azimuthal direction is on a reference plane parallel to a surface of the lower ring, and the azimuthal direction has an origin positioned at a center of the lower ring.

3. The antenna of claim 1, wherein the upper ring comprises:
a cover ring disposed on the lower ring; and
a slit plate disposed at a portion of a sidewall of the cover ring, the slit plate having the input slit.

4. The antenna of claim 3, wherein the cover ring has a hole receiving a portion of the slit plate.

5. The antenna of claim 1, wherein a first boundary surface between the input slit and the cavity extends in a direction different from a direction that a second boundary surface between the cavity and the output slits extends.

6. The antenna of claim 1, wherein each of the output slits has substantially the same size as the input slit.

7. The antenna of claim 1, wherein a width of the lower ring is substantially equal to a width of the upper ring.

8. The antenna of claim 1, wherein the input slit is disposed at an outer sidewall of the upper ring.

9. The antenna of claim 1, wherein the antenna includes a toroidal antenna.

10. The antenna of claim 1, wherein the output slits are arranged at intervals of first azimuths between 20 degrees and 35 degrees along an azimuthal direction of the lower ring,
wherein the input slit makes a second azimuth between 5 degrees and 8 degrees with the closest output slit and makes a third azimuth between 17 degrees and 23 degrees with the second closest output slit, and
wherein the azimuthal direction is on a reference plane parallel to a surface of the lower ring, and the azimuthal direction has an origin positioned at a center of the lower ring.

11. The antenna of claim 1, wherein the input slit receives the microwave power having an input frequency,
wherein the cavity resonates the microwave power to have a resonant frequency, and
wherein the input slit is disposed in a position that makes a second azimuth of 6.45 degrees with one of the closest two output slits to the input slit and makes a third azimuth of 19.25 degrees with the other of the closest two output slits to the input slit to match the resonant frequency equally with the input frequency.

12. An antenna comprising:
a lower ring having a plurality of output slits;
an upper ring disposed on the lower ring, the upper ring having an input slit; and a cavity formed between the lower ring and the upper ring, wherein the input slit is configured to transmit microwave power from an outside of the upper ring onto the lower ring, wherein the plurality of output slits is configured to transmit microwave power from the cavity to an outside of the lower ring, wherein the output slits are arranged at intervals of first azimuths between 20 degrees and 35 degrees along an azimuthal direction of the lower ring, wherein the input slit is disposed in a position that makes a second azimuth between 5 degrees and 8 degrees with one of the closest two output slits to the input slit and makes a third azimuth between 17 degrees and 23 degrees with the other of the closest two output slits to the input slit, and wherein the azimuthal direction is on a reference plane parallel to a surface of the lower ring, and the azimuthal direction has an origin positioned at a center of the lower ring.

13. The antenna of claim 12, wherein the input slit receives the microwave power having an input frequency into the input slit, wherein the cavity resonates the microwave power to have a resonant frequency, and wherein the resonant frequency and the input frequency are matched, when the input slit has the second azimuth with respect to the one of the closet two output slits and the third azimuth with respect to the other of the closet two output slits.

14. An antenna comprising:
a lower ring having a plurality of output slits;
an upper ring disposed on the lower ring, the upper ring having an input slit; and
a cavity formed between the lower ring and the upper ring, wherein the input slit is configured to transmit microwave power from an outside of the upper ring onto the lower ring, wherein the plurality of output slits is configured to transmit microwave power from the cavity to an outside of the lower ring, wherein the lower ring is configured to rotate along the upper ring, and wherein the output slits are configured to move in an azimuthal direction with respect to the upper ring, wherein each of the output slits comprises an opening defining a path in the lower ring through which the microwave power transmits, wherein the opening is configured to maintain its size when the output slits move in the azimuthal direction, wherein the azimuthal direction is on a reference plane parallel to a surface of the lower ring, and wherein the azimuthal direction has an origin positioned at a center of the lower ring.

15. The antenna of claim 14, wherein the upper ring comprises:
a cover ring having a hole having a size greater than that of the input slit; and
a slit plate disposed in the hole,
wherein the input slit is in the slit plate.

16. The antenna of claim 14, wherein the input slit receives the microwave power having an input frequency, wherein the cavity resonates the microwave power to have a resonant frequency, and wherein the input slit is disposed in a position that makes a first azimuth of 6.45 degrees with one of the closest two output slits to the input slit and makes a second azimuth of 19.25 degrees with the other of the closest two output slits to the input slit to match the resonant frequency equally with the input frequency.

* * * * *